United States Patent
Nojo et al.

(10) Patent No.: US 6,443,811 B1
(45) Date of Patent: Sep. 3, 2002

(54) CERIA SLURRY SOLUTION FOR IMPROVED DEFECT CONTROL OF SILICON DIOXIDE CHEMICAL-MECHANICAL POLISHING

(75) Inventors: Haruki Nojo, Kanagawa-Ken (JP); Sumit Pandey, Boston, MA (US); Jeremy Stephens, New Windsor; Ravikumar Ramachandran, Ossining, both of NY (US)

(73) Assignees: Infineon Technologies AG, Munich (DE); Internation Business Machines Corporation, Armonk, NY (US); Kabushiki Kaisha Toshiba, Kawasaki (JP)

( * ) Notice: Subject to any disclaimer, the term of this patent is extended or adjusted under 35 U.S.C. 154(b) by 32 days.

(21) Appl. No.: 09/597,125

(22) Filed: Jun. 20, 2000

(51) Int. Cl.$^7$ .................................................. B24B 1/00
(52) U.S. Cl. ............................ 451/41; 451/36; 451/60; 451/287; 451/288; 51/308; 51/309
(58) Field of Search .............................. 451/36, 41, 60, 451/287, 288; 51/308, 309

(56) References Cited

U.S. PATENT DOCUMENTS

| | | | |
|---|---|---|---|
| 3,715,842 A | 2/1973 | Tredinnick et al. | |
| 5,264,010 A | 11/1993 | Brancaleoni et al. | |
| 5,476,606 A | 12/1995 | Brancaleoni et al. | |
| 5,525,191 A | 6/1996 | Maniar et al. | |
| 5,543,126 A * | 8/1996 | Ota et al. | 423/263 |
| 5,693,239 A | 12/1997 | Wang et al. | |
| 5,876,490 A * | 3/1999 | Ronay | 106/3 |
| 6,207,477 B1 * | 3/2001 | Motooka et al. | 438/113 |
| 6,221,118 B1 * | 4/2001 | Yoshida et al. | 51/309 |
| 6,258,140 B1 * | 7/2001 | Shemo et al. | 51/308 |

* cited by examiner

Primary Examiner—Joseph J. Hail, III
Assistant Examiner—Shantese McDonald
(74) Attorney, Agent, or Firm—Stanton Braden

(57) ABSTRACT

An aqueous based ceria slurry system and method for chemical mechanical polishing of semiconductor wafers, the slurry comprising less than 5 wt % abrasive cerium oxide particles and up to about the critical micelle concentration of a cationic surfactant, absent other abrasives, in a neutral to alkaline pH solution is disclosed. Also disclosed is slurry comprising a blend of surfactants including a pre-existing amount of anionic surfactant and an added amount of cationic and/or non-ionic surfactant.

15 Claims, 3 Drawing Sheets

CERIA SLURRY SOLUTION FOR IMPROVED DEFECT CONTROL OF SILICON DIOXIDE CHEMICAL-MECHANICAL POLISHING

FIELD OF INVENTION

The present invention relates to improved defect control of silicon dioxide chemical-mechanical polishing (CMP) through chemistry modifications of a cerium oxide (ceria) slurry solution, and the use of this slurry for improved defect control. In particular, the present invention is concerned with an aqueous-based ceria slurry composition modified by the addition of a cationic surfactant to the slurry solution, and the use of the slurry for improved defect control on semiconductor wafers, specifically wafers that have been lithographically patterned at the shallow trench isolation (STI) level.

BACKGROUND OF THE INVENTION

In fabricating integrated circuits on semiconductor wafers, it is necessary for the semiconductor wafer to have a smooth, surface and a high degree of flatness. For this purpose, silicon is used as the semiconductor material and the wafers are obtained by slicing ingots of silicon. However, as silicon is a hard and brittle material, it is difficult to avoid small variations in the thickness of the wafers on slicing the ingot. Similarly, it is difficult to avoid microscopic surface scratches and other surface defects on the wafer, or to obtain a uniformly flat surface on the wafer on slicing the ingot. Since these defects, if not rectified, affect the quality and yield of integrated circuits, it is necessary to process the wafers to reduce the defects.

A standard method for reducing the defects is to polish the wafer using a slurry. Usually, in this polishing step, the wafer is pressed against a rotating pad while a slurry is added in between the pad and wafer. Thus, as the pad is rotated, the wafer is polished and flattened, and surface defects are reduced by a combination of a chemical-mechanical action, the chemical action due to the slurry solution, and the abrasive action due to the particles in the slurry. In using the slurry to polish the wafers, it is believed that the frictional heat and the chemical action promote the oxidation of a thin surface layer of the wafer. Simultaneously, as the pad is rotated against the wafer, the abrasive particles in the slurry abrade the oxidized layer to leave behind a relatively smooth, flat surface.

In addition to polishing the wafer prior to lithographic patterning, for some wafers, it is also necessary to polish the wafer after lithographic patterning, specifically at the shallow trench isolation level wherein shallow trenches are etched into the silicon and filled with silicon dioxide for device isolation. In this instance, a chemical-mechanical polishing (CMP) operation is required to planarize the silicon dioxide so that further circuit elements can be defined.

In the prior art, slurries containing abrasive particles suitable for use in CMP of semiconductors are known and have been used with varying degrees of success. FIG. 1 is an image from a Scanning Electron Microscope after a CMP operation showing a scratch on a surface. Typically, with prior art slurries, the abrasive component is one or more abrasive particles of silica in its various forms, alumina, titania and ceria. For example, U.S. Pat. No. 5,264,010, discloses a slurry composition comprising a mixture of fused silica, precipitated silica and ceria. Similarly, U.S. Pat. No. 5,876,490 discloses a slurry composition comprising abrasive particles and a polyelectrolyte wherein the charge on the polyelectrolyte is different from the charge on the abrasive particles.

Notwithstanding the availability of prior art CMP slurries, a persistent problem with the wafers is an unacceptably high surface defect density. These defects include particle contamination remaining on the surface after CMP (e.g. slurry particles stuck to the wafer, and other particles); scratches introduced onto the wafer surface by large particles, or by inappropriate contact with the polishing pad, or by particle contamination present on the wafer before CMP; or prior-level defects on the wafer that may grow due to the planarizing nature of the CMP operation. Accordingly, it desirable to have CMP slurry composition for polishing semiconductor wafers to reduce or eliminate an unacceptably high surface defect density.

SUMMARY OF THE INVENTION

In accordance with the objective of the present invention, there is provided an aqueous-based ceria slurry composition comprising a cationic surfactant in a neutral to alkaline pH solution. Also provided in accordance with the present invention is a method for polishing semiconductor wafers wherein the slurry of the invention is utilized to reduce surface defect density. The slurry of the invention preferably includes less than about 5 wt % of abrasive cerium oxide particles and up to about the critical micelle concentration of a cationic surfactant, absent other abrasives, in a neutral to alkaline pH aqueous solution. With the present slurry, surprisingly, the defect density is reduced compared to the defect density obtained with prior art slurries in CMP operations.

Without being bound by any particular theory, it is believed that the surfactant(s) in the present slurry chemisorb onto the surface of the wafer to protect the surface from polishing scratches and contamination. Thus, by providing the present slurry, the invention provides for improved yields in fabricating semiconductor devices.

DETAILED DESCRIPTION OF THE INVENTION

Figure 1:
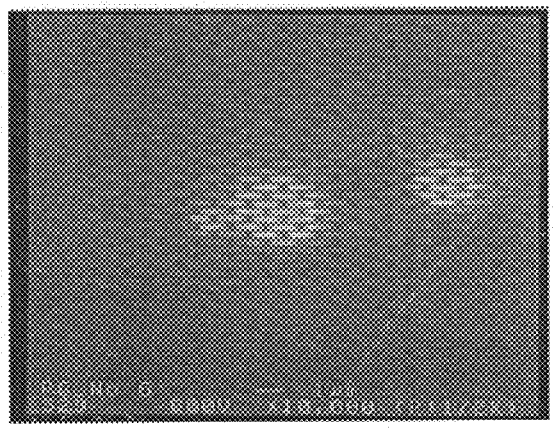
FIG. 1 is a Scanning Electron Microscope image of an example of CMP scratch after CMP with a ceria slurry solution in the prior art.

A reference herein to "percent" or "wt %", unless stated otherwise or unless the use is otherwise clear from the context, is the percentage by weight of the indicated component in relation to the total weight of the slurry. Similarly, "particle size", refers to the average diameter of the particles as measured by standard light scattering techniques.

In formulating slurries for use in CMP polishing of semiconductor wafers, it is known that a combination of abrasive materials in an aqueous solution of sodium hydroxide is useful to reduce surface defects. Thus, slurries comprising abrasives including silica, alumina and ceria have been used with varying degrees of success. To improve the effectiveness of these slurries, other materials have been added to the slurry; for example, the modification of ceria-based slurries for CMP operations using anionic polymers is reported by H. Nojo, M. Kodera, and R. Nakata, "Slurry Engineering For Self-stopping, Dishing Free SiO2-CMP," IEDM, pp. 349–353 (1996). In these prior art slurry systems, a common anionic polymer such as polyacrylic acid or ammonium poly acrylate is used to obtain self-limiting polishing, but the self-limiting polishing does not reduce scratching. Thus, under certain CMP of semiconductor wafers, when these slurries are used, the result is an unacceptably high level of surface scratches, particularly on wafers comprising adjacent layers of silicon dioxide and silicon. For such types of wafers, the usefulness of the prior art slurries is limited and therefore a more effective slurry is needed.

By the present invention, surprisingly, a ceria-based slurry to which a cationic surfactant is added significantly reduces the rate of surface defects on the wafer. In particular, a ceria-based slurry comprising ceria as the only abrasive component and to which a cationic surfactant is added significantly reduces surface scratches. Further, as the concentration of the added cationic surfactant in the slurry increases, surprisingly, the number of scratches per unit surface area of the wafer decreases. Similarly, the addition of the cationic surfactant to the slurry inhibits growth of surface defects on the wafer.

To formulate a slurry in accordance with the present invention, it is necessary that the cationic surfactant used is soluble and ionized in a ceria-based aqueous slurry wherein the pH of the slurry in the neutral to alkaline range. Accordingly, for the present purpose, at least the following four classes of cationic surfactants are suitable:

1. Alkyl-trimethyl-ammonium compounds; hexadecyl-trimethyl-ammonium bromide or cetyl-trimethyl ammonium bromide C16) are examples of this class of surfactant. (Alkyl=C6 to C18)

2. Alky-benzyl-dimethyl-ammonium compounds; hexadecyl-benzyl-dimethyl ammonium bromide and dodecyl-benzyl-dimethyl-ammonium bromide are examples that belong to this class of surfactant. (Alkyl=C6 to C18)

3. Pyridinium-alkyl compounds; cetyl-pyridinium-chloride is one example of a surfactant that belongs to this class of surfactant. (Alkyl=C6 to C18)

4. Alkyl-ammonium compounds, dodecylammonium acetate is one example of this class of surfactant. (Alkyl=C6 to C18)

Further, a mixture of surfactants from the above-cited classes can be utilized to formulate the slurry.

Without any desire to be bound by a particular theory, it is believed that in the slurry of the invention, the cationic surfactants present in the ceria-based, neutral to alkaline pH solution, strongly chemisorb onto the silica surface of the wafer and preferentially coats the surface. Thus, during the CMP operation the surface of the wafer is protected from agents that cause scratches.

The above-cited classes of suitable cationic surfactants have critical micelle concentrations (CMC), the concentration beyond which the surfactant tends to self-aggregate. Typically, the CMC concentration is in the range of less than 0.1 moles/liter. Thus, for use in the present invention, the effective concentration of added cationic surfactant is less than the critical micelle concentration, i.e., of about 0.1 moles/liter. However, it is recognized that for a particular surfactant, the effective concentration being dependent on the length of the molecule is determined by the concentration required to obtain zero zeta-potential values or higher. Such a concentration is between about 0.01 to about 1 millimoles/liter of surfactant in the aqueous solution. Preferably, the concentration of the surfactant in the slurry is lower than the CMC for the surfactant. Table 1 lists the CMC of a selected number of cationic surfactants suitable for use in the present invention.

TABLE 1

CMC values (in moles/liter) for some of the alkyl-trimethyl ammonium compounds and alkyl-pyridinium compounds [Source: M.J. Rosen, Surfactants and Interfacial Phenomena, John Wiley & Sons, N.Y., pp 96–97 (1978)]

| Surfactant | Solvent | CMC |
|---|---|---|
| Dodecyl-trimethyl ammonium bromide | Water at 25 C. | 1.6 E-2 |
| Dodecyl-pyridinium chloride | Water at 25 C. | 1.5 E-2 |
| Tetradecyl-trimethyl ammonium chloride | Water at 30 C. | 3.5 E-3 |
| Tetradecyl-pyridinium bromide | Water at 30 C. | 2.6 E-3 |
| Hexadecyl-trimethyl ammonium chloride | Water at 30 C. | 1.3 E-3 |
| Cetyl-pyridinium chloride | Water at 25 C. | 9.0 E-4 (≈0.03 wt %) |

Note, the CMC value shifts to lower concentrations as the length of the molecule increases.

Surprisingly, in accordance with the present invention, the addition of a non-ionic polymer to the slurry, such as polyacrylamide or polyvinyl alcohol, having a molecular weight of less than 10000 at a concentration level lower than about 1 wt. % is also effective to reduce defects. More preferably, an amount of about 0.01 wt. %, is useful.

A slurry, in accordance with the present invention, wherein only ceria is the abrasive material and wherein a cationic surfactant is added, is prepared by mixing water, sodium hydroxide, ceria and a cationic surfactant. In this slurry the ceria comprises less than about 5 wt. % of the slurry, and a suitable cationic surfactant added is cetyl pyridinium chloride (CPC) in a concentration of about 0.01 wt %. Optionally, in this slurry, an anionic surfactant added to about 0.2 to 6 wt. % is beneficial.

The slurry thus prepared is useable to polish wafers by the usual method known to the art, i.e., providing a small amount of the slurry to the surface of the wafer to be polished, and polishing the surface of the wafer by causing the slurry to mechanically-chemically abrade the surface layer, thereby removing scratches and surface defects.

Figure 2:
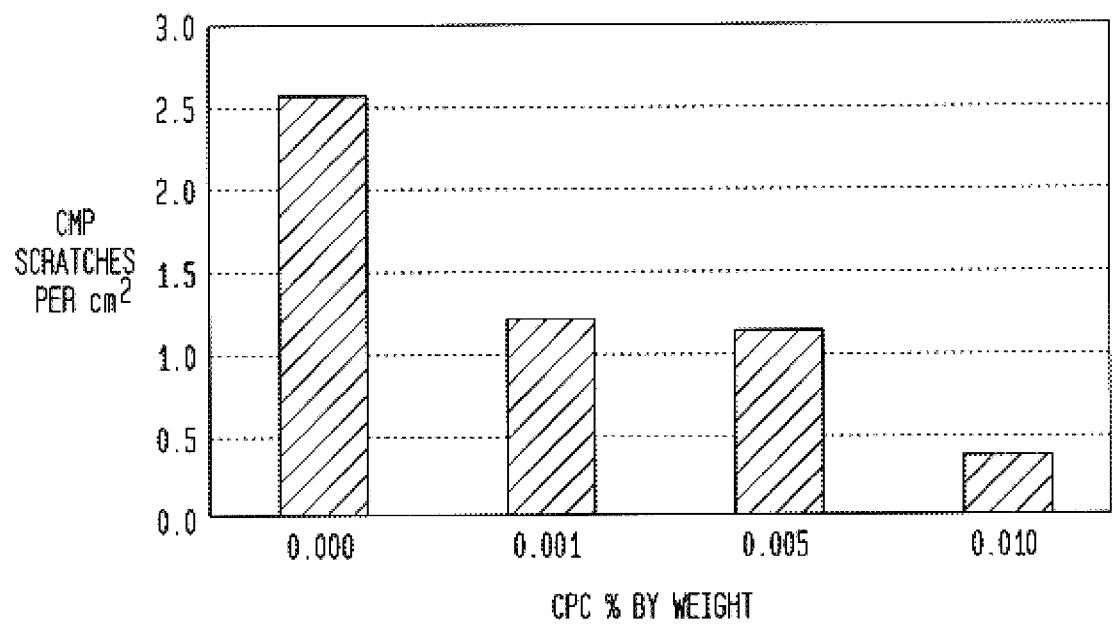
FIG. 2 depicts the reduction in surface scratches on a wafer utilizing the slurry of the present invention.

The results obtained from using the present slurry in CMP polishing is shown in FIGS. 2 and 3. FIG. 2 shows that without the CPC additive, the CMP scratch density is consistently above 1 scratch/cm$^2$. However, with a concentration of about 0.01 wt. % CPC, the scratch density is reduced to below 0.4 scratch/cm$^2$.

Figure 3A:
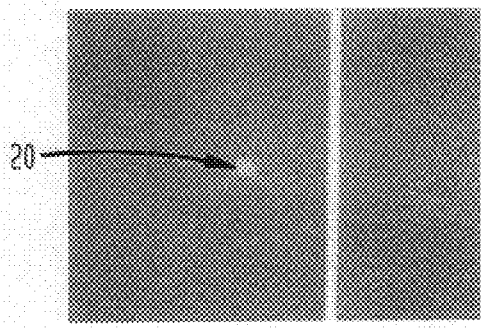
FIG. 3a depicts a defect before CMP in accordance with the prior art.
Figure 3C:
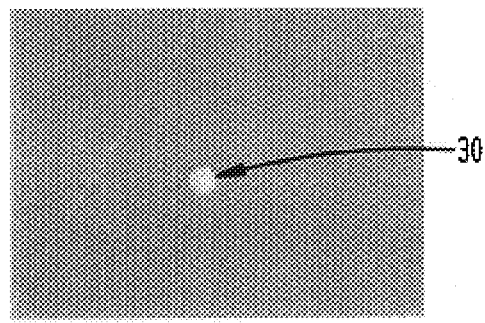
FIG. 3c depicts a defect before CMP in accordance with the present invention.
Figure 3B:
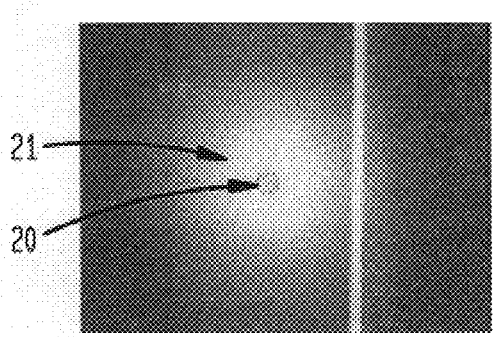
FIG. 3b depicts the defect growth of the defect in FIG. 3a after CMP in accordance with the prior art.
Figure 3D:
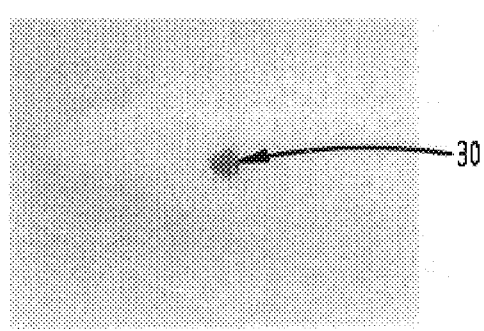
FIG. 3d reduced defect growth after CMP with the ceria slurry of the present invention.

Referring to FIGS. 3a–d, the effect on defect-growth during a CMP operation with and without the CPC in the slurry of the present invention is shown. FIGS. 3a and 3b are prior art before and after CMP images, respectively, showing a defect 20 which grows in area 21 due to polishing. Remarkably, a defect 30 of FIGS. 3c and 3d shows no signs of growth when employing the slurry of the present invention. FIG. 3c is an image before CMP, and FIG. 3d is an image after CMP in accordance with the present invention. Thus, as can be seen by Figures, the addition of the CPC to the slurry reduces prior level defect-growth.

Figure 4:
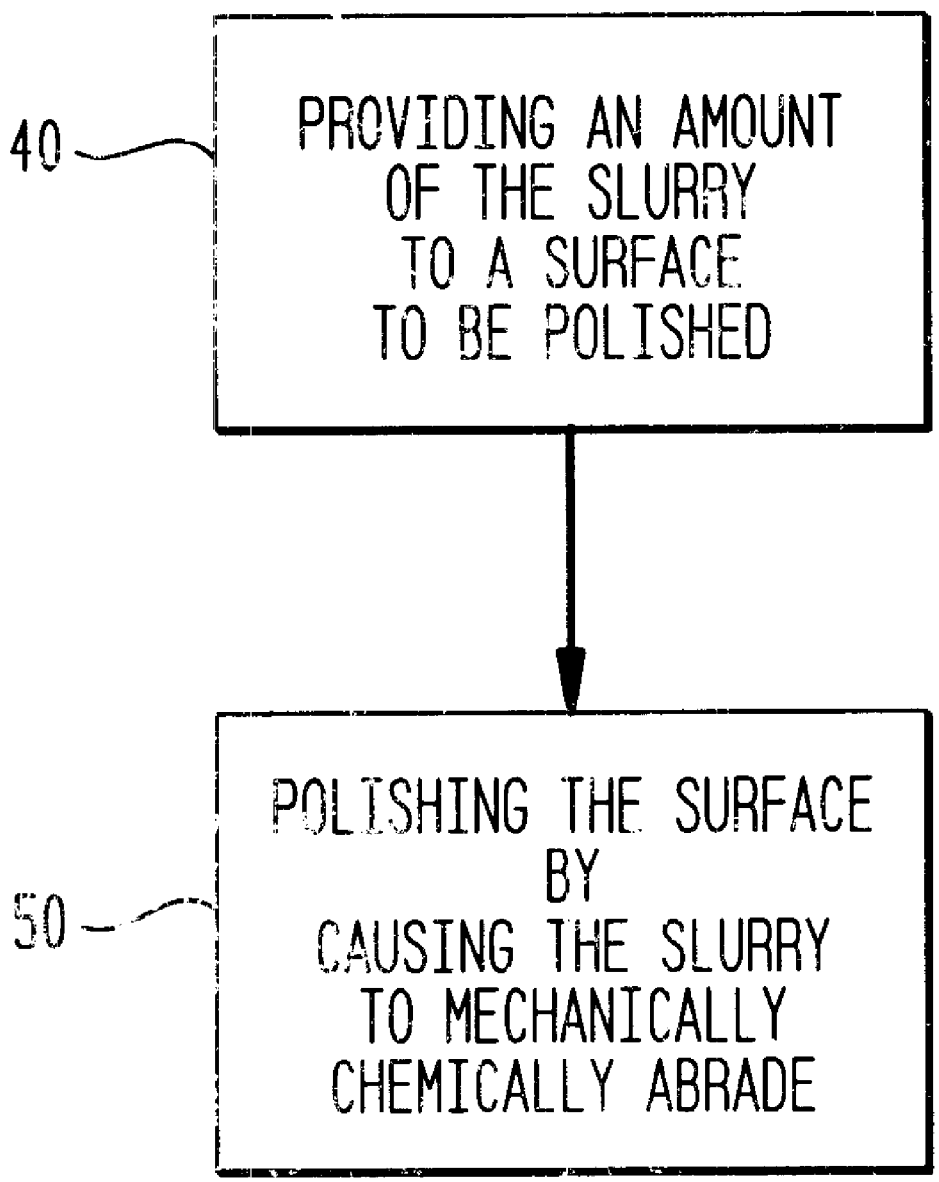
FIG. 4 is a flow chart for a method of employing the present invention for improved defect control.

Referring to FIG. 4, a flow diagram shows the steps which are employed for polishing a semiconductor device in accordance with the present invention. In block 40, the slurry of the present invention is applied to a surface to be polished. The surface preferably includes a silicon containing material, although the present invention may be applied to other materials. In block 50, the surface is polished.

While the invention has been described in terms of the above-disclosed preferred embodiments, there are alterations and equivalents that fall within the scope of the invention as claimed. It is therefore intended that the following appended claims be interpreted as including such alterations and equivalents within the spirit and scope of the invention.

What is claimed is:

1. An aqueous-based cerium oxide slurry composition useful for chemical-mechanical polishing semiconductor silicon wafers to reduce defect density, comprising less than about 5 wt % abrasive cerium oxide particles and up to about the critical micelle concentration of a cationic surfactant, absent other abrasives, in a neutral to alkaline pH solution.

2. The slurry of claim 1, further comprising between 2 and 6 wt % of an anionic surfactant.

3. The slurry of claim 2, wherein the wt % of the surfactants in the slurry is about 0.01 wt. % of cationic surfactant.

4. The slurry of claim 3, wherein the cationic surfactant is selected from one or more of the following surfactants:

Alykl-trimethyl-ammonium compounds,

Alkyl-benzyl-dimethyl-ammonium compounds, Pyridinium-alkyl compounds, and

Alkyl-ammonium compounds.

5. The slurry of claim 4 further comprising up to about 1 wt % of a non-ionic surfactant.

6. The slurry of claim 5 wherein the non-ionic surfactant is about 0.01 wt. %.

7. The slurry of claim 6 wherein the non-ionic surfactant is a non-ionic polymer.

8. The slurry of claim 7, wherein the non-ionic surfactant is a polyacrylamide or a polyvinyl alcohol having a molecular weights less than about 10000.

9. The slurry of claim 1, wherein the cationic surfactant is hexadecyl-trimethyl-ammonium bromide.

10. The slurry of claim 1, wherein the cationic surfactant is hexadecyl-benzyl-dimethyl ammonium bromide.

11. The slurry of claim 1, wherein the cationic surfactant is dodecyl-benzyl-dimethyl-ammonium bromide.

12. The slurry of claim 1, wherein the cationic surfactant is cetyl-pyridinium-chloride.

13. The slurry of claim 1, wherein the cationic surfactant is dodecylammonmium acetate.

14. A method for improved defect control of silicon dioxide chemical-mechanical polishing of a semiconductor silicon wafer through chemistry modification of the slurry solution, comprising:

providing an aqueous slurry to a surface of the wafer to be polished, said slurry comprising less than about 5 wt % abrasive cerium oxide particles and up to about the critical micelle concentration of a cationic surfactant, absent other abrasives, in a neutral to alkaline pH solution; and polishing the surface of the wafer by causing said slurry to mechanically-chemically abrade a surface layer of the semiconductor silicon wafer thereby removing scratches and surface defects.

15. The method of claim 14, wherein the step of polishing the wafer includes polishing regions of the wafer comprising embedded integrated electronic circuits, and wherein polishing the wafer includes polishing regions of said wafer having a plurablity of plateaus and gaps between the plateaus.

* * * * *